United States Patent [19]

Taneya

[11] Patent Number: 5,140,653
[45] Date of Patent: Aug. 18, 1992

[54] OPTICAL HEAD FOR A LASER PRINTER

[75] Inventor: Mototaka Taneya, Nara, Japan

[73] Assignee: Sharp Kabushiki Kaisha, Osaka, Japan

[21] Appl. No.: 703,252

[22] Filed: May 20, 1991

[30] Foreign Application Priority Data

May 21, 1990 [JP] Japan ............... 2-130480

[51] Int. Cl.⁵ .............................. G02B 6/10
[52] U.S. Cl. ........................... 385/4; 372/45
[58] Field of Search ............. 350/96.11–96.14; 372/45, 50, 43–46

[56] References Cited

U.S. PATENT DOCUMENTS

| | | | |
|---|---|---|---|
| 4,755,015 | 7/1988 | Uno et al. | 350/96.11 |
| 4,815,084 | 3/1989 | Scifres et al. | 372/46 |
| 4,904,045 | 2/1990 | Alferness et al. | 350/96.12 |
| 4,991,919 | 2/1991 | Nishiwaki et al. | 350/96.11 |

OTHER PUBLICATIONS

Noda, S., "Surface-Emitting Multiple Quantum Well Distributed Feedback Laser With a Broad-Area Grating Coupler", Electronics Letters, vol. 24, No. 5 (1988) pp. 277–278.

*Primary Examiner*—Akm E. Ullah
*Attorney, Agent, or Firm*—David G. Conlin; Robert F. O'Connell

[57] ABSTRACT

Light beams emitted from a semiconductor laser are introduced into an optical guide. The light beams linearly passing inside the optical guide are radiated one after another in the direction substantially perpendicular to the passing direction so as to be received by an optical modulator disposed on the optical guide over the length thereof, where the light beams are selectively modulated and then radiated out throughout the length thereof.

8 Claims, 2 Drawing Sheets

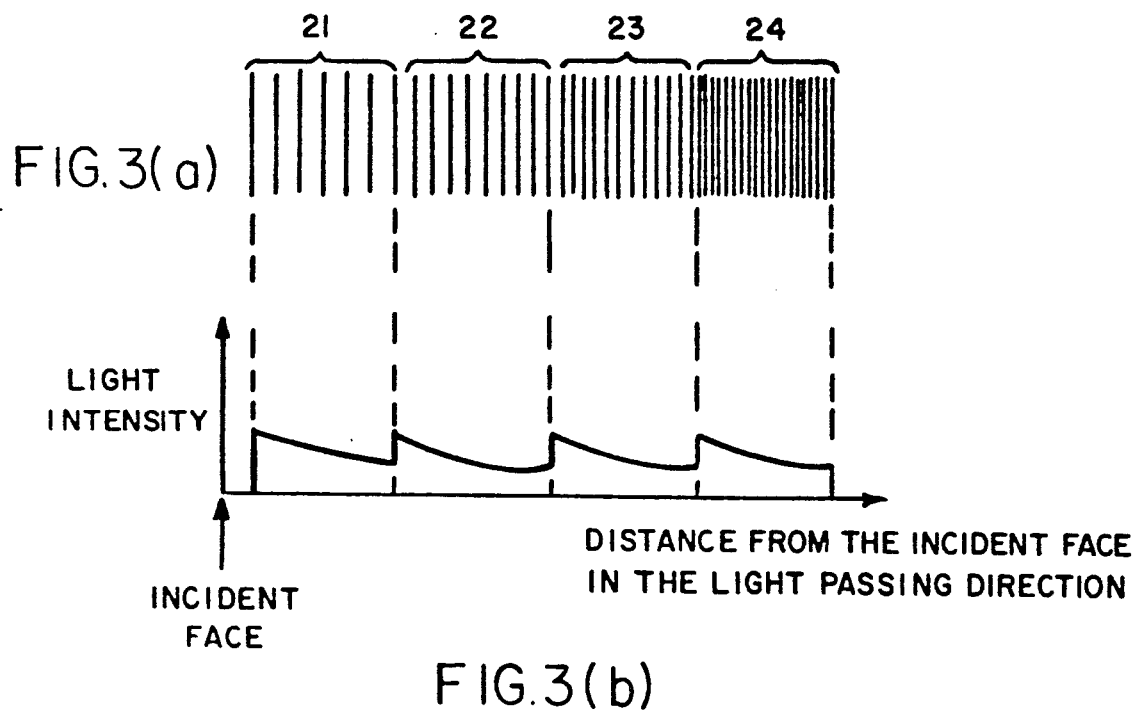
FIG.3(a)
FIG.3(b)
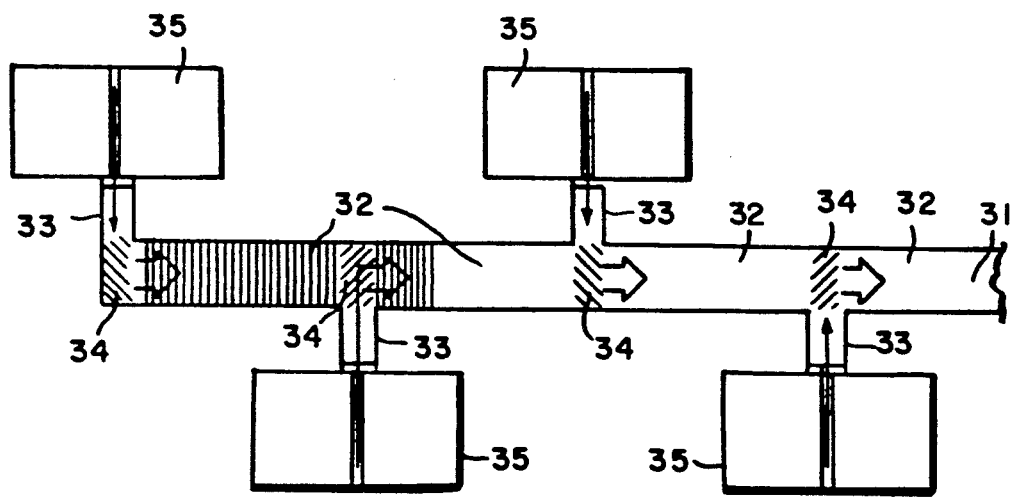
FIG.4

OPTICAL HEAD FOR A LASER PRINTER

BACKGROUND OF THE INVENTION

1. Field of the Invention

The present invention relates to an optical head for a laser printer, and more particularly to an optical head for a laser printer which includes no movable parts therein and in which a light source, an optical guide, an optical modulator, and the like are integrated to reduce the size.

2. Description of the Prior Art

A demand for a high-performance printer has increased with the enhanced functions of office apparatuses and the like. Particularly, a laser printer using a semiconductor laser as a light source, which has advantages such as reduced noise at printing and image forming with high resolution, is expected to be further improved for more sophisticated performance.

FIG. 5 is a schematic diagram of an optical head and a portion adjacent thereto of a conventional typical laser printer. In this laser printer, a modulated light beam 42 emitted from a semiconductor laser 41 is converged by a collimator lens 45 to be received by a polygon mirror 43, where the light beam 42 is deflected by rotation of the polygon mirror 43. The deflected light beam 42 is then converged again by a focus lens $f_0$, a cylindrical lens 47, etc. for scanning on a photosensitive drum 44. Thus, the semiconductor laser 41, the collimator lens 45, the polygon mirror 43, the focus lens $f_0$, the cylindrical lens 47, etc. constitute an optical head which emits light beams to the photosensitive drum 44. Only parts on the photosensitive drum 44 which are illuminated by the light beam 42 from the optical head are charged with electricity, to which toner attaches (not shown). The toner attaching on the photosensitive drum 44 is transferred to a sheet 48 which is conveyed synchronously with the rotation of the photosensitive drum 44. The toner transferred to the sheet 48 is then heat-treated so as to be fixed on the sheet 48, resulting in printing an intended image on the sheet 48.

An optical head for a laser printer using a hologram plate instead of the polygon mirror 43 has also been developed. Both optical heads can effect high resolution and high speed printing.

A different type of optical head from the above ones employing mechanical scanning has also been developed, in which a number of minute light emitting diodes (LED) are linearly arranged at intervals of as narrow as about 50 μm to form an LED array. In this type of the optical head, each LED is individually modulated and emits light beams to illuminate a photosensitive drum.

Further, a liquid crystal optical head for a laser printer has been developed, in which an optical modulator using a liquid crystal and disposed in front of a photosensitive drum modulates light beams radiated from a light source and transmits them to the photosensitive drum. In this optical modulator, light transmittance of each minute square of a grating of the liquid crystal is controlled so as to individually modulate light beams at each square. Furthermore, in order to solve the problem of the low responding speed of the liquid crystal in the above optical modulator, optical modulation by a magneto-optical shutter has been studied for practical application.

However, in the first type optical head which employs mechanical scanning, a high speed rotation part is required, causing the troubles of noise and wear. Also, since a certain amount of space is inevitably necessary for the scanning by light beams, it is difficult to reduce the size.

In the second type optical head which uses the LED array, more than 2,000 LED's are required, and each of such a large number of LED's must be controlled so as to attain uniform luminance thereof and thereby to minimize the possibility of nonuniformity of a printed image. Also, since such a large number of LED's must be set in array, it is difficult to attain high yield and prolonged life, thus having difficulty for practical use.

In the third type optical head which uses the liquid crystal shutter or the magneto-optical shutter for optical modulation, a light source such as a fluorescent lamp, a group of lenses to control light beams from the light source, an optical modulator, etc. must be arranged separately from each other when fabricated. This requires complicated adjustment among these components at fabrication, as well as making it difficult to reduce the size.

SUMMARY OF THE INVENTION

The optical head for a laser printer of this invention which overcomes the above-discussed and numerous other disadvantages and deficiencies of the prior art, comprises a light source, such as a semiconductor laser, an optical guide optically coupled with the semiconductor laser so that light beams emitted from the semiconductor laser are introduced thereinto, the optical guide allowing the light beams to linearly pass therein and to be radiated one after another in a direction substantially perpendicular to the passing direction, and an optical modulator disposed on the surface of the optical guide from which the light beams are radiated, the optical modulator having a plurality of areas which are arranged in an array so as to receive the light beams radiated one after another and whose light transmittance can be controlled independently from each other; wherein the semiconductor laser, the optical guide, and the optical modulator are combined to form one integrated unit.

In a preferred embodiment, the light source comprises a single semiconductor laser, and the light beams therefrom is introduced into the optical guide at one end thereof.

In a preferred embodiment, the optical modulator is a dot array liquid crystal shutter.

In a preferred embodiment, a grating is formed over the entire surface of the optical guide from which the light beams are radiated.

In a preferred embodiment, the cycle of the grating is constant over the entire surface of the optical guide from which the light beams are radiated.

In a preferred embodiment, the cycle of the grating is changed by stages along the passing direction of the light beams in the optical guide.

In a preferred embodiment, the cycle of the grating is gradually changed along the passing direction of the light beams in the optical guide.

In a preferred embodiment, the light source comprises a plurality of the semiconductor lasers, and the light beams emitted from each of the semiconductor lasers are introduced into the optical guide from each of a plurality positions disposed at appropriate intervals along the passing direction of the light beams.

Thus, in the optical head for a laser printer of the present invention, the light beams emitted from the semiconductor laser are introduced into the optical guide and, during passing therein, are radiated therefrom one after another in the direction perpendicular to the passing direction, thereby eliminating the necessity of mechanical rotation, as well as space for lenses required for scanning by light beams. In this way, this invention makes possible the objective of providing an optical head for a laser printer which is small and highly reliable as well as having reduced noise.

Moreover, the optical guide used in the optical head of this invention has, for example, a grating formed on the surface thereof from which the light beams are radiated so as to diffract the light beams passing therein in the direction perpendicular to the passing direction. By changing the cycle of the diffraction grating by stages or gradually along the passing direction, lowering of intensity of the light beams during passing in the optical guide is compensated, thereby making it possible to obtain a uniform intensity of light beams radiated throughout the optical guide.

Also, the intensity of the radiated light beams can be made uniform by introducing light beams emitted from a plurality of semiconductor lasers into the optical guide at positions located at appropriate intervals along the passing direction of light beams.

BRIEF DESCRIPTION OF THE DRAWINGS

This invention may be better understood and its numerous objects and advantages will become apparent to those skilled in the art by reference to the accompanying drawings as follows:

FIG. 3(a) is a plan view illustrating one example of a grating formed on the radiating surface of an optical guide, and FIG. 3(b) is a graph showing the relationship between the distance from the incident face of the optical guide and the intensity of radiated light beams in the example of FIG. 3(a);

FIG. 4 is a plan view illustrating optical guide layers and portions adjacent thereto of another example of the optical head according to the present invention.

DESCRIPTION OF THE PREFERRED EMBODIMENT

Example 1

Figure 1:
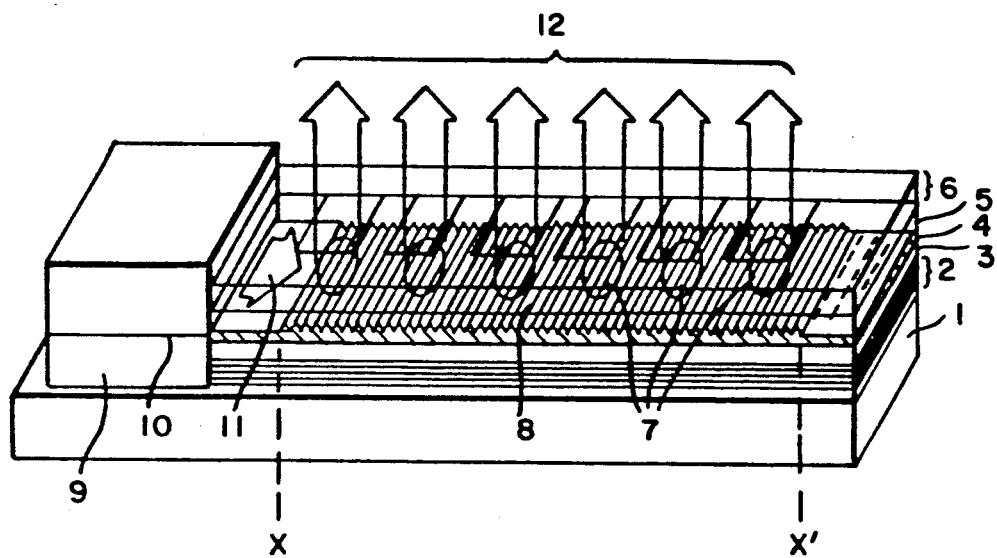
FIG. 1 is a partial perspective view illustrating an optical head according to the present invention.
Figure 2:
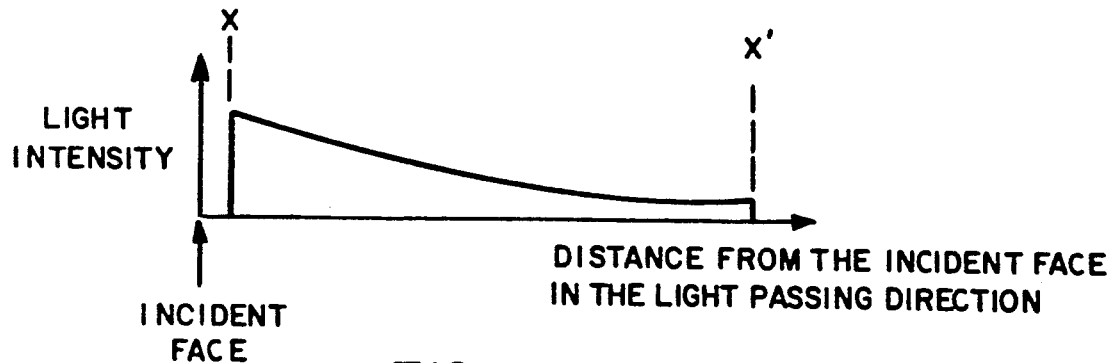
FIG. 2 is a graph showing the relationship between the distance from the incident face of an optical guide and the intensity of radiated light beams when the cycle of a grating formed on the radiating surface of the optical guide is constant along the passing direction of light beams.
Figure 5:
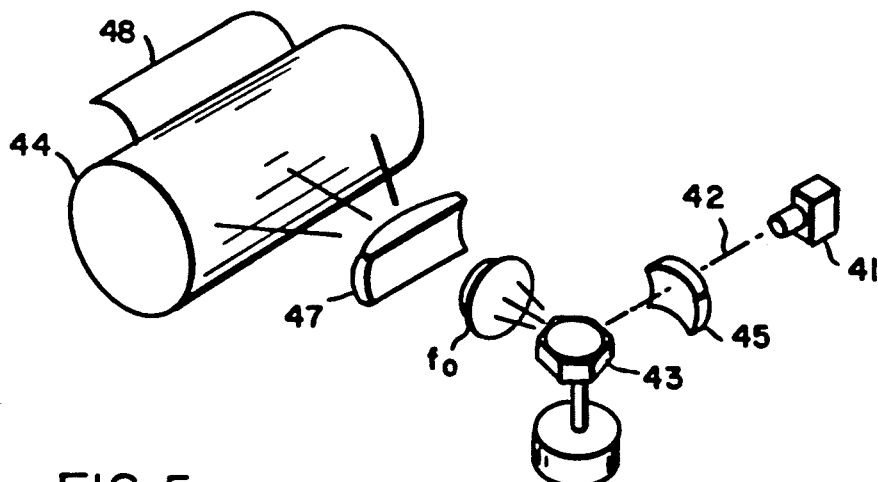
FIG. 5 is a schematic diagram of an optical head and a portion adjacent thereto of a conventional laser printer.

An optical head according to the present invention is partially shown in FIG. 1.

Referring to FIG. 1, the optical head comprises a ceramic substrate 1 made of Si or layered Si films, and a semiconductor laser 9 mounted on an area of one surface of the substrate 1 and capable of emitting laser beams having a wavelength of 780 nm. On the other area of the surface of the substrate 1 than that on which the semiconductor laser 9 is mounted, a reflection layer 2 formed of multilayered dielectric films which have a reflectance of 90% or more with respect to the 780 nm wavelength light beams. Films of $SiO_2$ and $Si_3N$, films of $Al_2O_3$ and $MgO$, or the like are layered alternately to form the reflection layer 2. On the reflection layer 2, a lower $SiO_x$ optical clad layer 3, and $SiO_y$ ($x<y$) optical guide layer 4, an upper $SiO_x$ optical clad layer 5, and a linear dot array liquid crystal shutter 6 using thin film transistors are layered one after another in this order. On the upper surface of the optical guide layer 4, a second order grating 8 having a cycle of about 300 nm is formed by means of interference exposure and etching. The dot array liquid crystal shutter 6 comprises a dot liquid crystal element in which a plurality of transparent electrodes are arranged in array at intervals of 60 $\mu$m. The transparent electrodes have a length of 40 $\mu$m in the direction of the array, and the voltage applied to them can individually be controlled. By controlling the voltage applied to each transparent electrode, part of the liquid crystal which is located on each transparent electrode is modulated for control of the individual light transmittance. In this way, the portion of the liquid crystal which corresponds to each transparent electrode forms a dot portion 7, and light beams passing through the dot portion 7 are radiated onto a photosensitive drum to form an image thereon.

The optical guide layer 4 disposed on the lower clad layer 3 is formed in a mesa shape, though not shown in FIG. 1, covered with the upper clad layer 5 not only on the top surface but also on the sides thereof. Thus, the optical guide layer 4 is enclosed by the lower clad layer 3 and the upper clad layer 5, resulting in effectively reduced loss of light beams radiated in the transverse direction. FIG. 1 only shows part of the optical head for a laser printer of this invention, but the actual lengths of the optical guide layer 4, the dot array liquid crystal shutter 6, etc. are as large as the image forming area, including some thousands of dot portions 7 in the dot array liquid crystal shutter 6.

The semiconductor laser 9 capable of emitting light having a wavelength of 780 nm is mounted on the Si substrate 1 in such a manner that an active layer 10 thereof opposes one longitudinal end face of the optical guide layer 4. Thus, the semiconductor laser 9 and the optical guide layer 4 are optically coupled by means of, for example, the butt joint method, so that laser beams emitted from the semiconductor laser 9 can be introduced into the optical guide layer 4.

In the optical head of this structure, light beams 11 emitted from the semiconductor laser 9 are introduced into the optical guide layer 4 at one end face thereof and pass in the optical guide layer 4. The light beams 11, during passing therein, interfere with the second order grating 8 formed on the upper surface of the optical guide layer 4, and are diffracted one after another in the directions substantially perpendicular to the passing direction. Since the light beams diffracted toward the substrate 1 are substantially completely reflected back by the reflection layer 2 formed on the surface of the substrate 1, all of the diffracted light beams 12 are, as a result, radiated from the surface on which the liquid crystal shutter 6 is disposed. The light beams diffracted at the optical guide layer 4 are introduced into the liquid crystal shutter 6, where light transmittance of each dot portion 7 is controlled by controlling the voltage applied to each transparent electrode, so that the light beams which have passed through certain dot portions 7 are radiated onto, for example, a photosensitive drum, as a result forming a certain pattern on the photosensitive drum.

Incidentally, the liquid crystal shutter 6 may be arranged so that portions thereof other than those where the transparent electrodes are disposed may have a reflectance of 50% or more, thus reducing loss of light beams as well as enhancing contrast of the formed image.

As described above, the optical head for a laser printer of this invention is manufactured in an integrated form in which the semiconductor laser 9 as a light source, the optical guide layer 4, and the liquid crystal shutter 6 as a linear optical modulator are organically coupled, eliminating the necessity of optical adjustment. Further, since a mechanical high speed rotation part, as well as space, for scanning by light beams are not necessary as in the case of the LED printer or the liquid crystal printer, reduced noise and simple structure will be achieved, thus making it possible to provide a small, inexpensive laser printer which can easily be maintained.

Example 2

In the optical head shown in FIG. 1, the light beams are introduced into the optical guide layer 4 from the semiconductor laser 9 as a single light source, and are diffracted one after another in the direction of the liquid crystal shutter 6 during passing in the optical guide layer 4. Therefore, when the optical guide layer 4 is uniform throughout the length thereof and the grating 8 has a constant cycle throughout the length thereof, the intensity of light beams radiated from the optical guide layer 4 becomes exponentially lower as the light beams are radiated at a place in the optical guide layer 4 farther from the incident face thereof. A photosensitive body normally utilized has a non-linear photosensitive property against the light intensity which changes depending on a threshold level, causing the possibility of showing no reaction against radiated light beams having low intensity. In order to avoid this possibility, light intensity must be high (about 100 to 200 mW) enough to allow sufficiently intense light beams to be radiated throughout the length of the optical guide layer 4. To emit high intensity of laser beams, great current must be applied to the semiconductor laser 9, which will shorten the life thereof. Generally speaking, the life of a semiconductor laser is shortened in inverse proportion to the fourth power of the light output thereof. Further, the portion adjacent to the incident face of the optical guide layer 4 receives intense light beams from the semiconductor laser 9 and in turn radiates them out to the corresponding portion of the liquid crystal shutter 6, whose life will also be shortened.

The above trouble can be solved by providing a grating structure as illustrated in FIG. 3(a) on the optical guide layer 4. In this grating structure, a plurality of areas 21, 22, 23, and 24 having the same length in the longitudinal direction of the optical guide layer 4 are provided from the incident face thereof in this order. Each of the areas has a different constant cycle from others; the diffraction is the eighth order in the area 21 most adjacent to the incident face, the sixth order in the next area 22, the fourth order in the area 23, and the second order in the area 24. When the diffraction order is high, the coupling efficiency of the grating with light beams inside the optical guide layer 4 becomes low. Thus, lowering of the intensity of light beams during passing in the optical guide layer 4 can be compensated, and, as shown in FIG. 3(b), a uniform intensity of the light beams radiated from the optical guide layer 4 into the liquid crystal shutter 6 throughout the length thereof can be achieved.

The grating formed on the optical guide layer 4 is not restricted to the above-described structure of changing the cycle by steps, but a grating structure of changing the cycle gradually depending on the function of the distance from the incident face may also be used to attain the above objective.

Example 3

The above objective of attaining a uniform intensity of light beams radiated from the optical guide layer 4 throughout the length thereof can also be accomplished by other structures than the above-described ones of providing a grating, such as one illustrated in FIG. 4. In this example of FIG. 4, a second order grating 32 is provided on areas of a main optical guide layer 31 other than a plurality of narrow areas placed at equal intervals along the passing direction of light beams, the main optical guide layer 31 corresponding to the optical guide layer 4 in FIG. 1. On these narrow areas on the main optical guide layer 31 is formed a third order grating 34 at an angle of 45° to the light beam passing direction. Each of the areas of the main optical guide layer 31 where the third order grating 34 is formed has on either side face thereof an auxiliary optical guide layer 33 extending in the direction transverse to the main optical guide layer 31. Any two adjacent auxiliary optical guide layers 33 extend in the opposite direction to each other with regard to the main optical guide layer 31. Each auxiliary optical guide layer 33 is optically connected to a semiconductor laser 35, and receives light beams emitted therefrom. The light beams received by each auxiliary optical guide layer 33 are introduced into the main optical guide layer 31 through the third order grating 34 formed at an angle of 45° to the passing direction of the light beams, and then pass inside the main optical guide layer 31 along the longitudinal direction thereof.

In this structure, lowering of the intensity of the light beams passing in the main optical guide layer 31 is compensated, attaining the uniform intensity of the light beams radiated in the direction perpendicular to the main optical guide layer 31 throughout the length thereof. As a result, the same light intensity distribution as shown in FIG. 3(b) is obtained. Moreover, since a plurality of semiconductor lasers 35 are used, high intensity of laser beams is not necessary for the individual semiconductor laser 35, relieving load thereon and thus preventing deterioration thereof. Also, high light output is not necessary for the individual semiconductor laser 35; therefore general inexpensive semiconductor lasers can be used to reduce cost. When any of the semiconductor lasers 35 become inoperative, total light output can be compensated by other semiconductor lasers to successfully form an image on a photosensitive body. For example, when one of the semiconductor lasers 35 having a predetermined normal output as low as 10 mW becomes inoperative, the output of other semiconductor lasers 35 may be changed to an appropriate value ranging from 12 to 15 mW. Such a small increase of output does not bring observable deterioration to each semiconductor laser 35, while enhancing contrast of the formed image. For monitoring whether the semiconductor lasers 35 are inoperative, a photoelectromotive force of a photodiode incorporated in each semiconductor laser 35 as an output monitor is utilized.

The small-sized optical head for a laser printer using a semiconductor laser with reduced noise according to this invention has been described hereinbefore by way of examples. However, the optical head for a laser printer of this invention is not limited to these examples, and the following variations, for example, are possible.

1. The photosensitive body may be a plate, not a drum.
2. The image forming may be performed by directly radiating light beams on a photosensitive or thermosensitive chromogenic sheet, not by attaching toner to the electrified photosensitive body.
3. A waveguide-shaped optical switch or deflection element utilizing magneto-optical or electro-optical effects may be used as a linear dot optical modulator, instead of the liquid crystal shutter.
4. A rod-shaped lens or a microlens may be interposed between the optical modulator and the photosensitive body to improve coupling efficiency of radiated light beams on the photosensitive body. Especially, such a lens may directly be contacted on the surface of the optical modulator.
5. A combination of a grating and a prism, and the like may be used so as to introduce laser beams emitted from the semiconductor laser into the optical guide.
6. Glass, plastic, or the like, instead of Si, may be used as material of the substrate for fabricating the optical head.
7. The upper and lower clad layers of the optical guide may be formed of plastic which is another dielectric than oxides. When using plastic clad layers, the pattern of grating can be made by stamping to reduce cost.
8. The optical guide, the optical modulator and the light source may be made separately, and then attached to each other by means of an adhesive, or connected by mechanical engagement or using a connector.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. An optical head for a laser printer comprising;
   a light source,
   an optical guide optically coupled with the light source so that light beams emitted therefrom are introduced into said optical guide, the optical guide allowing the light beams to pass therethrough in a linear direction and to be radiated therefrom sequentially one after another in a direction substantially perpendicular to the linear direction, and
   an optical modulator disposed on the surface of the optical guide from which the light beams are radiated, the optical modulator having a plurality of areas which are arranged in an array so as to receive the light beams radiated one after another and to control the light transmittances thereof independently of each other;
   wherein the light source, the optical guide and the optical modulator are combined to form one integrated unit.
2. An optical head according to claim 1, wherein the light source comprises a single semiconductor laser, and the light beams therefrom are introduced into the optical guide at one end thereof.
3. An optical head according to claim 1, wherein the optical modulator is a dot array liquid crystal shutter.
4. An optical head according to claim 1, wherein a grating is formed over the entire surface of the optical guide from which the light beams are radiated.
5. An optical head according to claim 4, wherein the cycle of the grating is constant over the entire surface of the optical guide from which the light beams are radiated.
6. An optical head according to claim 4, wherein the cycle of the grating is changed by stages along the linear direction of the light beams in the optical guide.
7. An optical head according to claim 4, wherein the cycle of the grating is gradually changed along the linear direction of the light beams in the optical guide.
8. An optical head according to claim 1, wherein the light source comprises a plurality of the semiconductor lasers, and the light beams emitted from each of the semiconductor lasers are introduced into the optical guide from each of a plurality of positions disposed at appropriate intervals along the linear direction of the light beams.

* * * * *